(12) United States Patent
Zheng et al.

(10) Patent No.: US 6,888,186 B2
(45) Date of Patent: May 3, 2005

(54) REDUCTION OF DAMAGE IN SEMICONDUCTOR CONTAINER CAPACITORS

(75) Inventors: Lingyi A. Zheng, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/338,287

(22) Filed: Jan. 8, 2003

(65) Prior Publication Data

US 2003/0098482 A1 May 29, 2003

Related U.S. Application Data

(62) Division of application No. 09/742,748, filed on Dec. 20, 2000, now Pat. No. 6,538,274.

(51) Int. Cl.[7] .............................................. H01L 27/108
(52) U.S. Cl. ...................................... 257/296; 257/309
(58) Field of Search ................... 438/255; 257/296–301, 257/303–309

(56) References Cited

U.S. PATENT DOCUMENTS

| | | | |
|---|---|---|---|
| 5,624,865 | A | 4/1997 | Schuegraf et al. |
| 6,015,997 | A | 1/2000 | Hu et al. |
| 6,124,164 | A | 9/2000 | Al-Shareef et al. |
| 6,159,793 | A | 12/2000 | Lou |
| 6,159,818 | A | 12/2000 | Durcan et al. |
| 6,162,666 | A | 12/2000 | Thakur et al. |
| 6,177,309 | B1 | 1/2001 | Lee |
| 6,184,074 | B1 | 2/2001 | Crenshaw et al. |
| 6,200,873 | B1 | 3/2001 | Schrems et al. |
| 6,235,605 | B1 | 5/2001 | Ping |
| 6,277,688 | B1 | 8/2001 | Tseng |
| 6,369,432 | B1 | 4/2002 | Jost et al. |
| 6,740,553 | B1 * | 5/2004 | Lee et al. ................... 438/240 |

FOREIGN PATENT DOCUMENTS

KR 2002055251 A * 7/2002 ......... H01L/27/108

OTHER PUBLICATIONS

Stanley Wolf Silicon Processing for the VSLI Era vol. 4 Lattice Press 2002 p. 146.*

* cited by examiner

Primary Examiner—David S. Blum
(74) Attorney, Agent, or Firm—Leffert Jay & Polglaze, P.A.

(57) ABSTRACT

Semiconductor container capacitor structures having a diffusion barrier layer to reduce damage of the bottom cell plate and any underlying transistor from species diffused through the surrounding insulating material are adapted for use in high-density memory arrays. The diffusion barrier layer can protect the bottom cell plate, any underlying access transistor and even the surface of the surrounding insulating layer during processing including pre-treatment, formation and post-treatment of the capacitor dielectric layer. The diffusion barrier layer inhibits or impedes diffusion of species that may cause damage to the bottom plate or an underlying transistor, such as oxygen-containing species, hydrogen-containing species and/or other undesirable species. The diffusion barrier layer is formed separate from the capacitor dielectric layer. This facilitates thinning of the dielectric layer as the dielectric layer need not provide such diffusion protection. Thinning of the dielectric layer in turn facilitates higher capacitance values for a given capacitor surface area.

30 Claims, 7 Drawing Sheets

REDUCTION OF DAMAGE IN SEMICONDUCTOR CONTAINER CAPACITORS

RELATED APPLICATIONS

This is a divisional application of U.S. patent application Ser. No. 09/742,748, filed Dec. 20, 2000, now U.S. Pat. No. 6,538,274, titled "REDUCTION OF DAMAGE IN SEMICONDUCTOR CONTAINER CAPACITORS," which is commonly assigned, the entire contents of which are incorporated herein by reference.

TECHNICAL FIELD OF THE INVENTION

The present invention relates generally to development of semiconductor container structures, and in particular to the development of semiconductor container capacitor structures in conjunction with a diffusion barrier layer overlying a surrounding insulating layer and to apparatus making use of such container capacitor structures.

BACKGROUND OF THE INVENTION

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. The top plate of each capacitor is typically shared, or common, with each of the other capacitors. The charge stored across the capacitor is representative of a data bit and can be either a high voltage or a low voltage.

Data can be either stored in the memory cells during a write mode, or data may be retrieved from the memory cells during a read mode. The data is transmitted on signal lines, referred to as bit lines, which are coupled to input/output (I/O) lines through transistors used as switching devices. Typically, for each bit of data stored, its true logic state is available on an I/O line and its complementary logic state is available on an I/O complement line.

The memory cells are typically arranged in an array and each cell has an address identifying its location in the array. The array includes a configuration of intersecting conductive lines and memory cells are associated with the intersections of the lines. In order to read from or write to a cell, the particular cell in question must be selected, or addressed. The address for the selected cell is represented by input signals to an address decoder. In response to the decoded address, row access circuitry activates a word line. The selected word line activates the access transistors for each of the memory cells in communication with the selected word line. In response to the decoded column address, column access circuitry selects a bit line. For a read operation, the selected word line activates the access transistors for a given word line address, and data is latched to the selected bit line.

As DRAMs increase in memory cell density, there is a continuing challenge to maintain sufficiently high storage capacitance despite decreasing memory cell size and its accompanying capacitor surface area, since capacitance is a function of surface area. Additionally, there is a continuing goal to further decrease memory cell size.

A principal approach to increasing cell capacitance is through cell structure techniques. Such techniques include three-dimensional cell capacitors, such as trenched or stacked capacitors. One common form of stacked capacitor structure is a cylindrical container stacked capacitor, with a container structure forming the bottom plate of the capacitor. Another method of increasing cell capacitance is through the use of high surface-area materials such as hemispherical-grain polysilicon (HSG) which increase available surface area for a given foot print due to their roughened or irregular surfaces. Additional approaches to increasing cell capacitance may include reducing the thickness of the dielectric layer of the cell capacitor.

As cell size decreases, container structures must be formed in closer proximity to neighboring container structures. At close proximity, care must be taken to avoid shorting the bottom plates of adjacent cell capacitors. Capacitors having such shorted container structures will result in defective memory cells, as the cells will be unable to accurately store data.

For the reasons stated above, and for other reasons stated below that will become apparent to those skilled in the art upon reading and understanding the present specification, there is a need in the art for alternative semiconductor container capacitor structures and methods of producing same.

SUMMARY

Semiconductor container capacitor structures having a diffusion barrier layer to reduce damage of the bottom cell plate and any underlying transistor from species diffused through the surrounding insulating material are described herein. The diffusion barrier layer can protect the bottom cell plate, any underlying access transistor and even the surface of the surrounding insulating layer during processing including pre-treatment, formation and post-treatment of the capacitor dielectric layer. The diffusion barrier layer inhibits or impedes diffusion of species that may cause damage to the bottom plate or an underlying transistor, such as oxygen-containing species, hydrogen-containing species and/or other undesirable species, such as fluorine-containing species or chlorine-containing species. The diffusion barrier layer is formed separate from the capacitor dielectric layer. This facilitates thinning of the dielectric layer as the dielectric layer need not provide such diffusion protection. Thinning of the dielectric layer in turn facilitates higher capacitance values for a given capacitor surface area.

For one embodiment, the invention provides a semiconductor container capacitor structure. The semiconductor container capacitor structure includes a bottom plate overlying sidewalls and a closed bottom of a container hole, wherein the sidewalls of the container hole are defined by a surrounding insulating layer. The structure still further includes a dielectric layer overlying the bottom plate and a top plate overlying the dielectric layer. The structure further includes a diffusion barrier layer overlying at least a portion of a surface of the insulating layer adjacent the container hole. The diffusion barrier layer may be interposed between the upper surface of the insulating layer and dielectric layer or interposed between the dielectric layer and the top plate. For a further embodiment, the diffusion barrier layer contains a silicon-based material. For still further embodiments, the diffusion barrier layer contains a material having a diffusion rate for one or more oxygen-containing species, hydrogen-containing species, fluorine-containing species and/or chlorine-containing species that is lower than a diffusion rate for such species through the insulating layer.

For another embodiment, the invention provides a semiconductor container capacitor structure. The structure includes a container hole having sidewalls, an open top and a closed bottom, wherein the sidewalls of the container hole are defined by a surrounding insulating layer and wherein the open top of the container hole is defined by an upper surface of the insulating layer. The structure further includes a first conductive layer overlying the sidewalls and closed bottom of the container hole and a diffusion barrier layer overlying the upper surface of the insulating layer. The structure still further includes a dielectric layer overlying the first conductive layer and the diffusion barrier layer and a second conductive layer overlying the dielectric layer. A majority of the surface area of the first conductive layer is substantially devoid of the diffusion barrier layer.

For yet another embodiment, the invention provides a semiconductor container capacitor structure. The structure includes a container hole having sidewalls, an open top and a closed bottom. The sidewalls of the container hole are defined by a surrounding insulating layer and the open top of the container hole is defined by an upper surface of the insulating layer. The structure further includes a first conductive layer overlying the sidewalls and closed bottom of the container hole and a dielectric layer overlying the first conductive layer and the upper surface of the insulating layer. The structure still further includes a diffusion barrier layer overlying a first portion of the dielectric layer overlying the upper surface of the insulating layer and leaving a remaining portion of the dielectric layer substantially uncovered by the diffusion barrier layer. The remaining portion of the dielectric layer includes the majority of the surface area of the dielectric layer. The structure still further includes a second conductive layer overlying the diffusion barrier layer and the remaining portion of the dielectric layer.

For still another embodiment, the invention provides a semiconductor container capacitor structure. The structure includes a layer of conductively-doped hemispherical-grain polysilicon in a container hole, wherein the container hole has sidewalls, an open top and a closed bottom. The sidewalls of the container hole are defined by a surrounding insulating layer and the open top of the container hole is defined by an upper surface of the insulating layer. The structure further includes a first layer of silicon nitride on the upper surface of the insulating layer and a portion of the layer of conductively-doped hemispherical-grain polysilicon. The structure still further includes a second layer of silicon nitride on the first layer of silicon nitride and a remaining portion of the layer of conductively-doped hemispherical-grain polysilicon. The structure still further includes a layer of conductively-doped polysilicon on the second layer of silicon nitride.

For yet another embodiment, the invention provides a method of forming a semiconductor capacitor. The method includes forming a first conductive layer overlying sidewalls and a closed bottom of a container hole, wherein the sidewalls of the container hole are defined by a surrounding insulating layer, and forming a diffusion barrier layer overlying an upper surface of the insulating layer. The method further includes forming a dielectric layer overlying the first conductive layer and the diffusion barrier layer and forming a second conductive layer overlying the dielectric layer. For further embodiments, the method includes forming a diffusion barrier layer of a dielectric material having a diffusion rate for oxygen-containing species that is lower than a diffusion rate for the oxygen-containing species through the insulating layer. For still further embodiments, the method includes forming a diffusion barrier layer of a dielectric material having a diffusion rate for hydrogen that is lower than a diffusion rate for hydrogen through the insulating layer. For still further embodiments, the method includes forming the diffusion barrier layer overlying and adjoining the upper surface of the insulating layer and further overlying and adjoining a first portion of the first conductive layer, wherein the remaining portion of the first conductive layer includes a majority of the surface area of the first conductive layer.

For another embodiment, the invention provides a method of forming a semiconductor capacitor. The method includes forming a layer of conductively-doped hemispherical-grain polysilicon in a container hole, wherein the container hole has sidewalls, an open top and a closed bottom. The sidewalls of the container hole are defined by a surrounding insulating layer and the open top of the container hole is defined by an upper surface of the insulating layer. The method further includes forming a first layer of silicon nitride on the upper surface of the insulating layer and a first portion of the layer of conductively-doped hemispherical-grain polysilicon and forming a second layer of silicon nitride on the first layer of silicon nitride and a remaining portion of the layer of conductively-doped hemispherical-grain polysilicon. The method still further includes forming a layer of conductively-doped polysilicon on the second layer of silicon nitride.

Further embodiments of the invention include semiconductor container capacitor structures and methods of varying scope, as well as apparatus and systems making use of such semiconductor container capacitor structures and methods.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/ junctions. The following detailed description is, therefore, not to be taken in a limiting sense, and the scope of the present invention is defined only by the appended claims and equivalents thereof.

Figure 1:
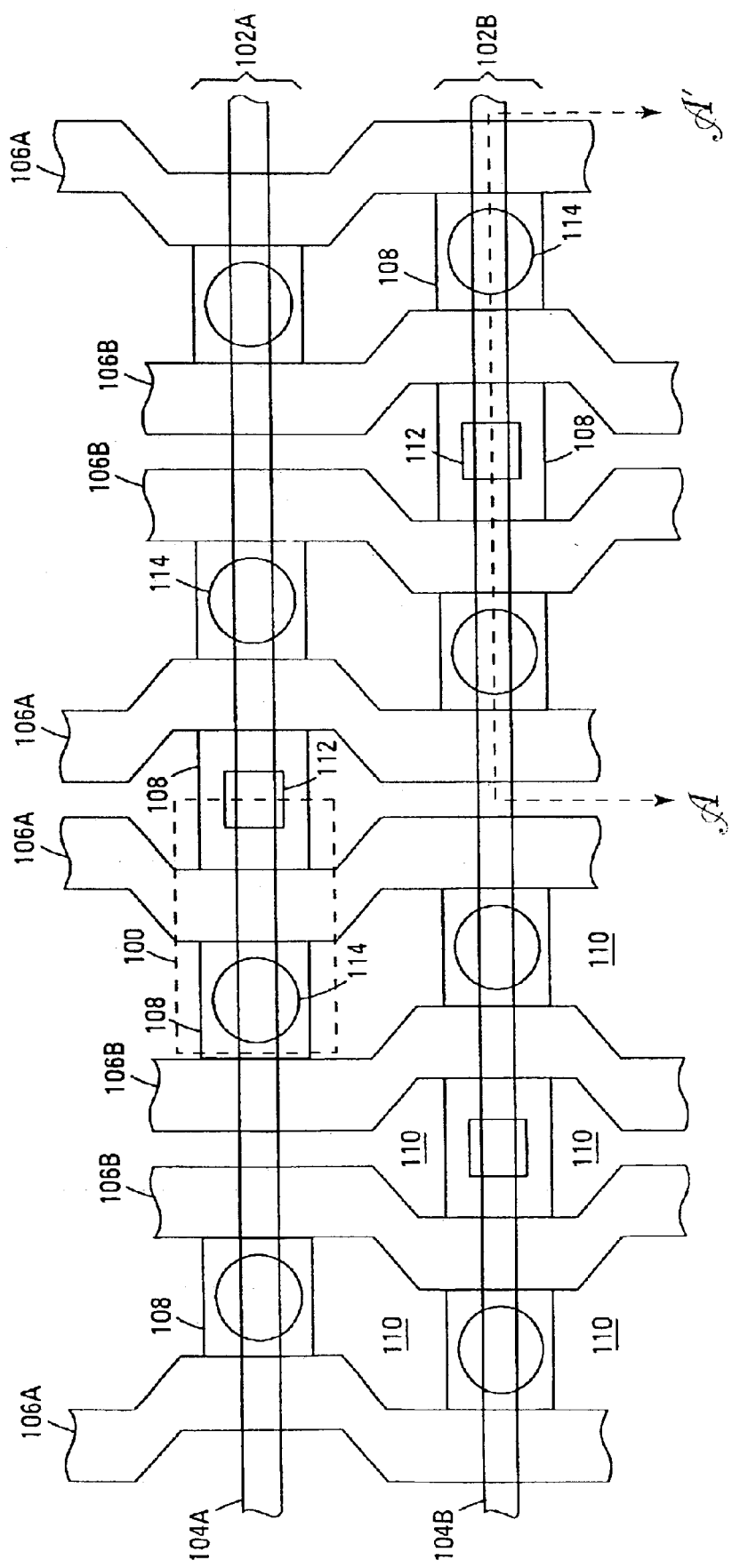
FIG. 1 is a top view of a memory array layout in accordance with an embodiment of the invention.

FIG. 1 is a top view of a memory array layout in accordance with an embodiment of the invention. The memory array includes container capacitor memory cells 100 formed overlying active areas 108. Active areas 108 are separated by field isolation regions 110. Active areas 108 and field isolation regions 110 are formed on a substrate.

Each memory cell 100 includes a container capacitor 114 and an access transistor. The access transistor is defined by a word line 106 and has a first source/drain region associated with the container capacitor 114 and a second source/drain region associated with a bit line contact 112. At least one container capacitor 114 is formed in conjunction with a diffusion barrier layer as described herein.

The memory cells 100 are arranged substantially in rows and columns. Shown in FIG. 1 are portions of two columns 102A and 102B. Separate bit lines 104A and 104B are formed overlying columns 102A and 102B, respectively. Bit line 104A couples to portions of active areas 108 through bit line contacts 112. Word lines 106A and 106B are further coupled to portions of active areas 108, with word lines 106A coupled to active areas 108 in columns 102A and word lines 106B coupled to active areas 108 in columns 102B. The word lines 106A and 106B, coupled to memory cells in this alternating fashion, generally define the rows of the memory array. This folded bit-line architecture is well known in the art for permitting higher densification of memory cells 100.

FIGS. 2A–2H depict fabrication of a portion of the memory device of FIG. 1 in accordance with one embodiment of the invention. FIGS. 2A–2H are cross-sectional views taken along line A–A' of FIG. 1 during various processing stages.

Figure 2A:
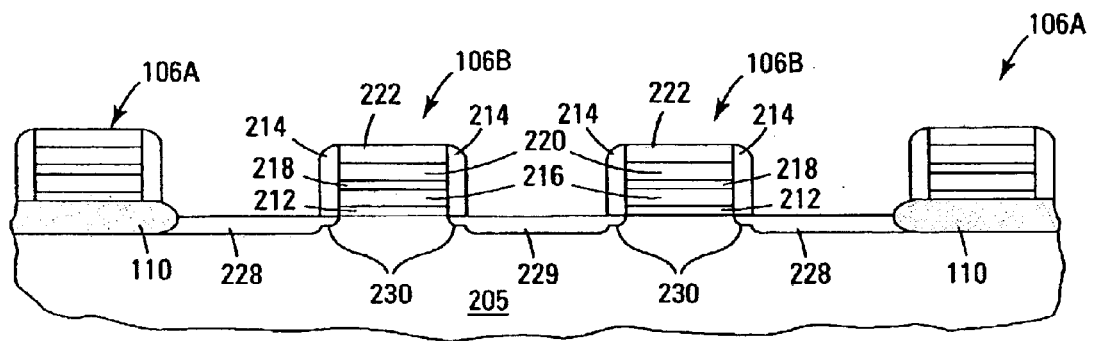
FIGS. 2A–2H are cross-sectional views of a substrate during various stages of forming a container capacitor structure in accordance with an embodiment of the invention.

In FIG. 2A, field isolation regions 110 are formed on a substrate 205. Substrate 205 may be a silicon substrate, such as a p-type monocrystalline silicon substrate. Field isolation regions 110 are generally formed of an insulator or dielectric material, such as silicon oxides (SiO/SiO$_2$), silicon nitrides (SiN/Si$_2$N/Si$_3$N$_4$) and silicon oxynitrides (SiO$_x$N$_y$). For this embodiment, field isolation regions 110 are formed of silicon dioxide such as by conventional local oxidation of silicon (LOCOS) which creates substantially planar regions of oxide on the substrate surface. Active areas 108 are those areas not covered by the field isolation regions 110 on substrate 205. The creation of the field isolation regions 110 is preceded or followed by the formation of a gate dielectric layer 212. For this embodiment, gate dielectric layer 212 is a thermally grown silicon dioxide, but may be other dielectric materials described herein or known in the art.

Following the creation of the field isolation regions 110 and gate dielectric layer 212, a first conductively-doped gate polysilicon layer 216, a gate barrier layer 218, a gate conductor layer 220, a gate cap layer 222 and gate spacers 214 are formed by methods well known in the art. Gate barrier layer 218 may be a metal nitride, such as titanium nitride (TiN) or tungsten nitride (WN$_x$). Gate conductor layer 220 may be any conductive material and is increasingly a metal such as tungsten (W). Gate cap layer 222 is often silicon nitride while gate spacers 214 are generally of a dielectric material such as silicon oxide, silicon nitride and silicon oxynitride. The foregoing layers are patterned to form word lines 106 as gates for field-effect transistors (FET) as the access transistors of the memory cells. The construction of the word lines 106 are illustrative only. As a further example, the construction of the word lines 106 may include a refractory metal silicide layer overlying a polysilicon layer. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. Other constructions for word lines 106 are well known in the art and generally include a gate stack of one or more conductive layers overlying a gate dielectric layer, with the sidewalls and top of the gate stack insulated with dielectric material.

Source/drain regions 228 and 229 are formed in the substrate 205 such as by conductive doping of the substrate 205. The active areas 108 include the source/drain regions 228 and 229 as well as the channel regions between the first source/drain regions 228 and the second source/drain region 229.

Source/drain regions 228 and 229 have a conductivity type opposite the substrate 205. For a p-type substrate, source/drain regions 228 and 229 would have an n-type conductivity. Such conductive doping may be accomplished through ion implantation of phosphorus, arsenic or other n-type dopant species for this embodiment. Doping may further be accomplished through diffusion of the dopant species, such as gaseous diffusion or diffusion at an interface of a layer of heavily-doped material and the substrate 205. As is often the case, source/drain regions 228 and 229 include lightly-doped regions 230 created by differential levels of dopant concentration or even differing dopant species. Lightly-doped regions 230 are often formed through angled implantation of the dopant species to extend beneath the word lines 106 and to coincide with or underlap the gate dielectric layer 212.

The formation of the word lines 106 as described are exemplary of one application to be used in conjunction with various embodiments of the invention. Other methods of fabrication and other applications are also feasible and perhaps equally viable. For clarity and to focus on the formation of the capacitor structures, many of the reference numbers are eliminated from subsequent drawings, particularly those reference numbers pertaining to the structure of the word lines and the source/drain regions.

Figure 2B:
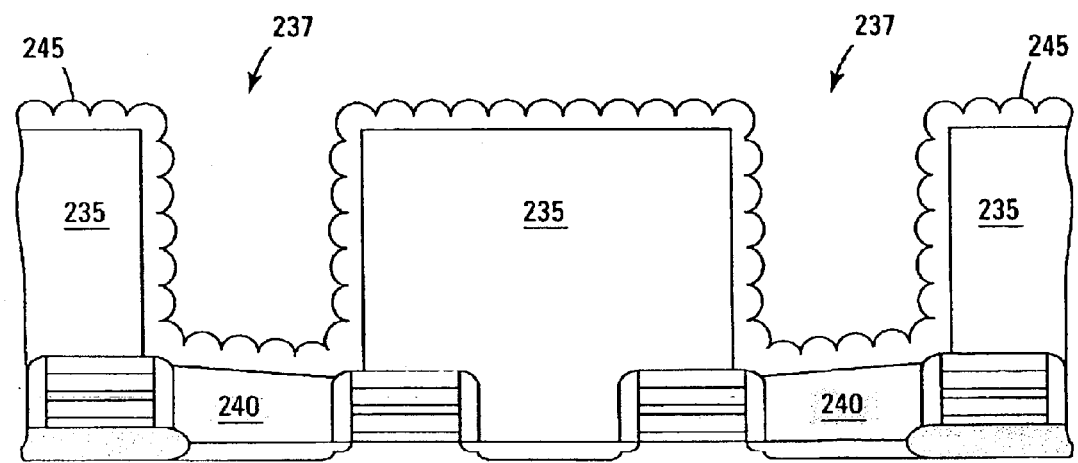

In FIG. 2B, a thick first insulating layer 235 is deposited overlying substrate 205, as well as word lines 106, field isolation regions 110, first source/drain regions 228 and second source/drain regions 229. The first insulating layer 235 is a dielectric material such as silicon oxide, silicon nitride and silicon oxynitride materials. For one embodiment, the first insulating layer 235 is a doped dielectric material such as borophosphosilicate glass (BPSG), a boron and phosphorous-doped silicon oxide material. The first insulating layer 235 is generally planarized, such as by chemical-mechanical planarization (CMP), in order to provide a uniform height. The first insulating layer 235 is then patterned to define areas for future cell capacitors. Patterning of the first insulating layer 235 exposes first source/drain regions 228 on opposing sides of the word lines 106B.

Patterning of the first insulating layer 235 may include standard photolithographic techniques to mask portions of the first insulating layer 235 and to expose portions of the first insulating layer 235 where future cell capacitors are to be formed. The exposed portions of the first insulating layer 235 are then removed. The portions of the first insulating layer 235 may be removed by etching or other suitable removal technique known in the art. Removal techniques are generally dependent upon the material of construction of the layer to be removed as well as the surrounding or underlying layers to be retained.

Following patterning of the first insulating layer 235, a layer of conductively-doped polysilicon or other conductive material is formed overlying exposed portions of the first source/drain regions 228 to form contacts or contact plugs 240. As one example, contact plugs 240 may be formed by controlled deposition of polysilicon to cover only the exposed first source/drain regions 228 and perhaps the surface of the first insulating layer 235. Any material deposited on the surface of the first insulating layer 235 may be removed such as by CMP. Alternatively, layer of conductive material may be blanket deposited followed by an etch-back to leave a layer of conductive material overlying the first source/drain regions 228. For still further embodiments, contact plugs 240 may be formed from tungsten, titanium nitride, tungsten nitrides, tantalum nitride, aluminum or other conductive materials, metals or alloys.

A bottom capacitor plate 245 or first conductive layer is formed overlying at least the closed bottoms and sidewalls of the container holes 237. The bottoms of the container holes 237 are defined at least in part by the surface of the contact plugs 240 while the sidewalls of the container holes 237 are defined by the surrounding first insulating layer 235. The container holes 237 further have open tops defined by an upper surface of the first insulating layer 235.

The bottom plate 245 is coupled to or in electrical communication with the contact plugs 240. The bottom plate 245 is any conductive material. For one embodiment, the bottom plate 245 is a conductively-doped polysilicon. For a further embodiment, the bottom plate 245 is a conductively-doped hemispherical-grain (HSG) polysilicon. For additional embodiments, the conductive material of the bottom plate 245 may contain metals, metal nitrides, metal alloys or conductive metal oxides.

The bottom plate 245 may be formed by any method, such as collimated sputtering, chemical vapor deposition (CVD) or other deposition techniques. In the case of a metal nitride material, the bottom plate 245 may be deposited as a metal layer followed by nitridation. For embodiments containing HSG polysilicon, the bottom plate 245 may be formed by a variety of methods known in the art, including low pressure CVD (LPCVD) and silicon deposition followed by vacuum anneal under specified temperature and pressure conditions. The bottom plate 245 may further contain a layer of HSG polysilicon formed on a layer of polysilicon.

Subsequent annealing of the memory device may produce a reaction between the bottom plate 245 and the contact plug 240 such than an interface layer is formed. As an example, where the bottom plate 245 includes a silicon-containing material and the contact plug 240 includes a metal-rich material, subsequent annealing can produce a refractory metal silicide interface between the bottom plate 245 and the contact plug 240. Such metal silicide interface layers are often advantageous in reducing electrical resistance to the contact plug 240.

Figure 2C:
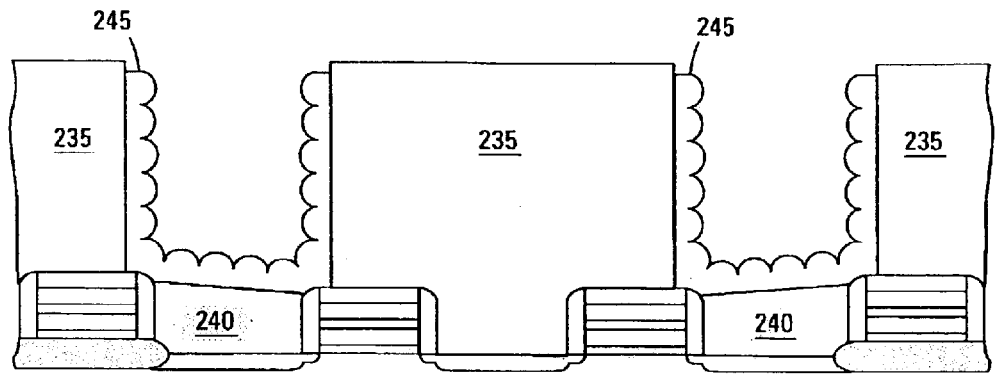

In FIG. 2C, any portions of the bottom plate 245 formed on the upper surface of the first insulating layer 235 are removed, such as by CMP, chemical etch or reactive-ion etching (RIE). Removal of surface material eliminates bridging of the conductive material between the container holes 237. Note that complete removal is not necessary as long as isolation of adjacent container holes 237 is achieved. The resulting structures define individual bottom plates 245 for the future cell capacitors as shown in FIG. 2C.

Although the use of the container structure and the roughened surface of materials like HSG polysilicon provide increased surface area of the bottom plate 245, this alone may be insufficient to provide adequate capacitance levels as device sizes continue to reduce. An additional method of increasing capacitance includes thinning of the capacitor dielectric layer. Many dielectric materials, e.g., silicon nitride, aluminum oxide ($Al_2O_3$) and tantalum pentoxide ($Ta_2O_5$), may require a post-formation treatment process such as oxidation or reoxidation to repair areas that may be conductive or otherwise prone to leakage. Many dielectric materials, e.g., silicon nitride, aluminum oxide ($Al_2O_3$) and tantalum pentoxide ($Ta_2O_5$), may further require a pre-treatment process, e.g., an ammonia ($NH_3$) anneal or a phosphine ($PH_3$) anneal, of the bottom plate 245 prior to formation of the dielectric layer to achieve desired electrical properties.

Care must be taken to avoid the damage of the bottom plate 245 and any underlying access transistor caused by undesirable species diffusing through the first insulating layer 235 during such treatment of the dielectric layer after formation, treatment of the underlying structure prior to formation of the dielectric layer, or even during the process used to form the dielectric layer. This concern becomes increasingly problematic where formation of the dielectric layer is preferential to surfaces of the bottom plate 245. As an example, in a structure as shown in FIG. 2C, with a bottom plate 245 containing HSG polysilicon and the first insulating layer 235 containing BPSG, formation of a silicon nitride dielectric layer by CVD is preferential to the HSG polysilicon; formation of a dielectric layer having a thickness of approximately 50 Å on the HSG polysilicon portion of the structure may result in a thickness of less than 20 Å on the BPSG portion of the structure. This is due to the longer incubation time of silicon nitride deposition on BPSG versus HSG polysilicon. While the thickness of the dielectric layer overlying the bottom plate 245 may be sufficient to protect the bottom plate 245 from oxidation damage from within the container hole 237, the thickness of the dielectric layer overlying the surface of the first insulating layer 235 may become too thin to sufficiently inhibit oxygen-containing species from diffusing through the first insulating layer 235 and attacking the bottom plate 245 from the outside of the container hole 237. Oxygen containing species diffusing through the first insulating layer 235 may oxidize the bottom plate 245. In many cases, such oxidation may result in volume expansion of the bottom plate 245. The volume expansion of the bottom plate 245 may further compress the first insulating layer 235 between adjacent cell capacitors. This can result in massive failure of a memory device resulting from shorting of the bottom plates 245 of adjacent cell capacitors.

Volume expansion of the bottom plate 245 is not the only concern from undesirable diffusion. Diffusion of oxygen-containing species, hydrogen-containing species and other undesirable species to the underlying active area can shift the electrical characteristics of the access transistor due to oxidation of the contacts, changes in the dopant profile, dopant deactivation, and more. Such shifts in electrical characteristics may result in malfunction of the access transistor.

The various embodiments of the invention address such diffusion damage concerns by providing a diffusion barrier layer covering portions of the surface of the first insulating layer 235 between cell capacitors. The diffusion barrier layer is separate and distinct from the capacitor dielectric layer, thus permitting thinning of the dielectric layer overlying the bottom plate 245 independent of concerns of insufficient thickness overlying the first insulating layer 235 or poor diffusion barrier properties of the dielectric layer. The diffusion barrier layer is formed separately from the dielectric layer with separate processing so that it can be formed without damaging the device yet still provide protection to the device from damage during pre-treatment, formation and/or post-treatment of the dielectric layer. Note that separate processing may include continuation of a formation process using a different set of operating conditions to produce the differing deposition characteristics, e.g. using CVD under a first set of operating conditions to discourage deposition on the sidewalls and bottom of the container holes 237 and then under a second set of operating conditions to encourage deposition on the sidewalls and bottom of the container holes 237.

Figure 2D:
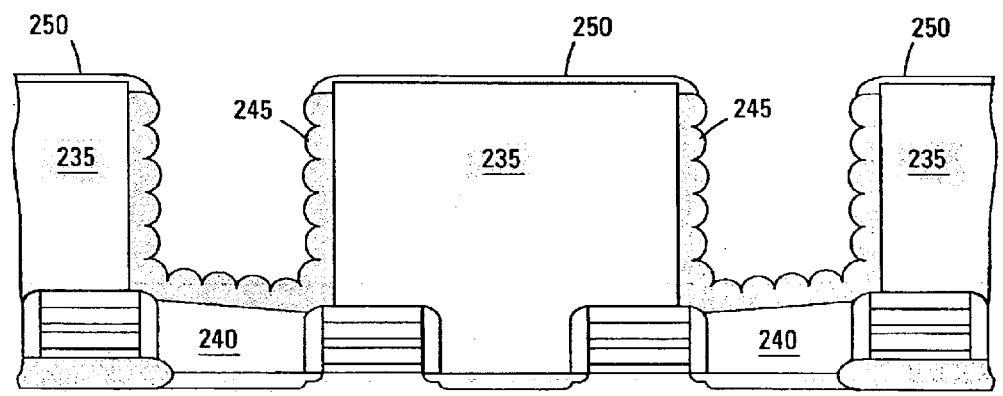

As shown in FIG. 2D, a diffusion barrier layer 250 or first dielectric layer is formed overlying at least the surface of the first insulating layer 235 between cell capacitors. The diffusion barrier layer 250 is shown to be adjoining the bottom electrode 245, but there is no prohibition to forming additional layers interposed between the diffusion barrier layer 250 and the first insulating layer 235 described above. Such additional layers may be used to enhance adhesion or barrier properties between adjacent layers. However, any such additional layers should generally be non-conductive to avoid shorting adjacent bottom plates 245;

To ensure cleanliness of the bottom plate 245 and the surface of the first insulating layer 235, an appropriate pre-clean and/or etch process can be applied prior to formation of the diffusion barrier layer 250 or some preceding layer. Such processes can be used to remove contaminants to improve adhesion and to achieve better electrical properties in the resulting structure. One example may be a diluted hydrofluoric acid (HF) solution. Other cleaning and etchant solutions are known in the art containing a variety of acidic species, surfactants, solvents and more. In the case of an etch process, the sidewalls of the first insulating layer 235 may be slightly recessed to obtain higher capacitance values. Use of such cleaning or etching processes may be used between any two layers to improve adhesion and/or performance of the resulting structure.

The diffusion barrier layer 250 is a dielectric material capable of inhibiting or at least impeding diffusion of oxygen-containing species often used in subsequent oxidation or reoxidation of a capacitor dielectric layer. Such oxygen-containing species may include diatomic oxygen ($O_2$), ozone ($O_3$) and/or oxygen radicals. For one embodiment, the diffusion barrier layer 250 is a silicon-based material. For a further embodiment, the diffusion barrier layer 250 is silicon nitride. For a still further embodiment, the diffusion barrier layer 250 is a silicon oxynitride. Other silicon-based dielectric materials may also be used, such as a silicon carbide material ($C_2Si/CSi/CSi_2$). For another embodiment, the diffusion barrier layer 250 is any dielectric material having a diffusion rate for oxygen-containing species that is lower than a diffusion rate for the same oxygen-containing species through doped or undoped silicon dioxide. For yet another embodiment, the diffusion barrier layer 250 is any dielectric material having a diffusion rate for oxygen-containing species that is lower than a diffusion rate for the same oxygen-containing species through the insulating layer 235. Diffusion rate is a measure of an amount of a species passing through a barrier in a given period for a given barrier thickness, temperature, pressure and initial concentration of the species. For additional embodiments, the diffusion barrier layer 250 may have a diffusion rate for hydrogen ($H_2$), ammonia ($NH_3$), phosphine ($PH_3$), fluorine ($F_2$) or chlorine ($Cl_2$) that is lower than the diffusion rate for hydrogen, ammonia, phosphine, fluorine or chlorine, respectively, through the insulating layer 235.

The bottom plate 245 should be substantially devoid of, or not covered by, the diffusion barrier layer 250. In this manner, the diffusion barrier layer 250 does not significantly impact the resulting capacitance of the cell capacitor. As shown in FIG. 2D, diffusion barrier layer 250 only extends over the top portions of the bottom plates 245. For one embodiment, a majority of the surface area of each bottom plate 245 is substantially devoid of diffusion barrier layer 250. For a further embodiment, at least 95% of the surface area of each bottom plate 245 is substantially devoid of diffusion barrier layer 250. For a still further embodiment, at least 99% of the surface area of each bottom plate 245 is substantially devoid of diffusion barrier layer 250. Increasing the portion of the surface area of the bottom plate 245 uncovered by the diffusion barrier layer 250 reduces any detrimental impact of the diffusion barrier layer 250 on the resulting capacitance of the capacitor structure. However, it may be desirable to cover at least a portion of the bottom plate 245. For embodiments where the diffusion barrier layer 250 extends past an edge of the first insulating layer 235 to cover a top portion of the bottom plate 245, an additional advantage is observed in that leakage current at the corner of the resulting cell capacitor is reduced.

The diffusion barrier layer 250 is preferably formed by a method that will produce a layer of material on the surface of the first insulating layer 235 in preference to the sidewalls of the bottom plate 245. This is generally referred to as poor step coverage. The diffusion barrier layer 250 is further preferably formed by a method that will produce a layer of material on the surface of the first insulating layer 235 in preference to the bottom of the bottom plate 245. Using such processes, the diffusion barrier layer 250 can be formed on the surface of the first insulating layer 235 while leaving the sidewalls and bottom of the bottom plate 245 substantially devoid of the material of the diffusion barrier layer 250. This further allows control over the thickness of the diffusion barrier layer 250 to provide sufficient protection from diffusion of oxygen-containing species without detrimental impact on the capacitance of the resulting cell capacitor. While it is conceivable to form the diffusion barrier layer 250 as a blanket deposition followed by removal of material from within the container holes 237, it is preferable to avoid such extra processing.

A variety of deposition processes can be made to preferentially deposit on the upper surface, including CVD, plasma-enhanced CVD (PECVD), photo-assisted CVD and physical vapor deposition (PVD) techniques using appropriate operating conditions. For one embodiment, the diffusion barrier layer 250 is silicon nitride formed by PECVD. Due to the high aspect ratio of the container holes 237, PECVD silicon nitride will preferentially deposit on the upper or horizontal surface of the first insulating layer 235 and will generally not deposit on the sidewalls or bottom of the bottom plate 245. The plasma will enhance reaction of the PECVD precursors at the surface of the first insulating layer 235 near, but will be generally incapable of aiding reaction in the container holes 237. This phenomena results in preferentially depositing material on the surface of the first insulating layer 235. Diffusion barrier layers 250 having a thickness of up to approximately 150 Å have been produced using PECVD with no detectable deposit of material on the sidewalls and bottom of the bottom plate 245.

It is recognized that due to degrees of step coverage of various deposition methods, some dielectric material may deposit on the sidewalls or bottom of the bottom plate 245. However, any such deposition layer on the sidewalls or bottom of the bottom plate 245 will be substantially thinner than the deposition layer on the surface of the first insulating layer 235 due to the preferential formation on the surface of the first insulating layer 235. A subsequent strip process using a dip or spray of acid or other appropriate stripping solution can be used to remove such undesirable dielectric material from the sidewalls and bottom of the bottom plate 245 before significantly impacting thickness of the diffusion barrier layer 250 on the surface of the first insulating layer 235. For one embodiment, the diffusion barrier layer 250 has a thickness of approximately 150 Å. For another embodiment, the diffusion barrier layer 250 has a thickness of approximately 45 Å. For yet another embodiment, the diffusion barrier layer 250 has a thickness sufficient to substantially eliminate oxidation of the bottom plate 245 by oxygen-containing species diffused through the first insulating layer 235 during reoxidation of a subsequent capacitor dielectric layer.

For an alternate embodiment, the diffusion barrier layer 250 is formed through sputtering of a dielectric material onto the surface of the first insulating layer 235. As with the PECVD process, the high aspect ratio impedes deposition into the container holes 237. Sputtering at an angle may be used to further reduce the ability of the diffusion barrier layer 250 to form on the bottom of the bottom plate 245. For another embodiment, the diffusion barrier layer 250 is formed through photo-assisted CVD. Similar to PECVD, the light source used to enhance reaction of the CVD precursors will generally not penetrate the container holes 237, thus preferentially depositing the diffusion barrier layer 250 on the surface of the first insulating layer 235. Other methods of forming the diffusion barrier layer 250 on the surface of the first insulating layer 235 may also be used.

Figure 2E:
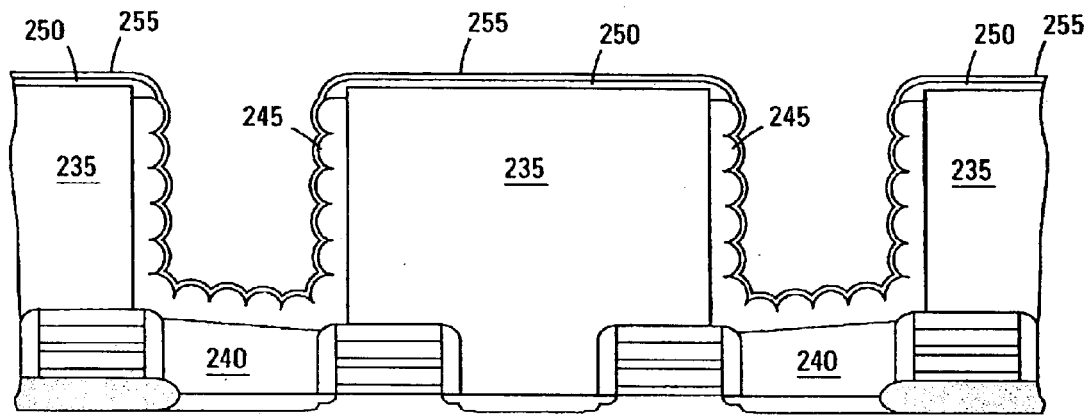

In FIG. 2E, a dielectric layer 255 or second dielectric layer is formed overlying the diffusion barrier layer 250 and the bottom plate 245. The dielectric layer 255 is shown to be adjoining the diffusion barrier layer 250, but there is no prohibition to forming additional non-conductive layers interposed between the dielectric layer 255 and the diffusion barrier layer 250 described above.

Dielectric layer 255 contains a dielectric material. For one embodiment, dielectric layer 255 contains silicon nitride. For another embodiment, dielectric layer 255 contains a silicon oxynitride. Other dielectric materials may also be used, including dielectric metal oxides. Some examples include $Ba_zSr_{(1-z)}TiO_3$ [BST; where 0<z<1], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, $Al_2O_3$ and $LiNbO_3$. The dielectric layer 255 may be formed by any deposition technique, e.g., RF-magnetron sputtering, CVD or other suitable deposition technique. Subsequent to formation, dielectric layer 255 may be annealed in an oxygen-containing ambient, such as an ambient containing oxygen ($O_2$) or ozone ($O_3$), at a temperature within the range of approximately 200 to 1000° C. The actual oxygen-containing ambient, concentration of oxygen species and annealing temperature may vary for the specific dielectric material deposited. These variations are well known to those skilled in the art.

While silicon nitride and silicon oxynitrides are generally good dielectric materials, vacancies within a dielectric material adversely affect its performance in the dielectric layer 255. Vacancies within such dielectric materials describe an oxygen and/or nitrogen content less than stoichiometric amounts, thus resulting in a silicon-rich silicon nitride or oxynitride. Silicon-rich materials tend to be conductive or leaky. Annealing in an oxygen-containing ambient can provide extra oxygen to the dielectric material to take up the excess silicon and to repair vacancies. While the exposure to the oxidizing environment must be controlled to avoid unnecessary oxidation of the bottom plate 245, the protection of the bottom plate 245 from diffusion of the oxygen-containing species through the first insulating layer 235 provides additional margin during the oxidation process; repair of vacancies within the dielectric layer 255 can be accomplished with reduced concern of oxidation of the bottom plate 245 from multiple surfaces, i.e., from the inside and the outside of the container hole 237.

It is noted that the diffusion barrier layer 250 may enhance nucleation of a CVD-deposited dielectric layer 255, especially where the diffusion barrier layer 250 and the dielectric layer 255 contain the same material, e.g., silicon nitride. The resulting dielectric layer 255 overlying the surface of the first insulating layer 235 will thus have a thickness greater than if it were deposited directly on the first insulating layer 235. The combined thickness of the diffusion barrier layer 250 and the dielectric layer 255 contributes to the diffusion barrier capabilities. Accordingly, the diffusion barrier layer 250 may be reduced to a thickness insufficient in itself to produce the desired diffusion barrier properties, but sufficient when combined with the subsequent dielectric layer 255 to produce the desired diffusion barrier properties.

Figure 2F:
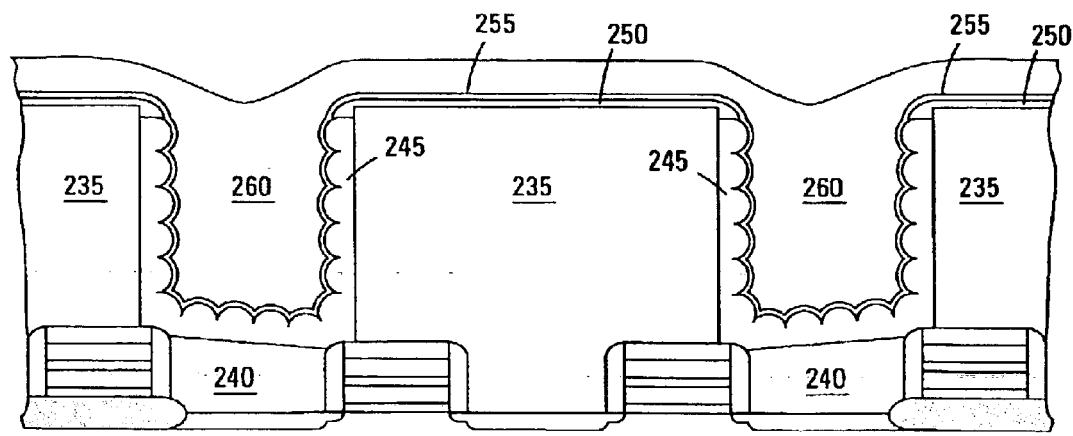

In FIG. 2F, a top cell plate 260 or second conductive layer is formed overlying the dielectric layer 255. The top plate 260 is shown to be adjoining the dielectric layer 255, but there is no prohibition to forming additional layers interposed between the top plate 260 and the dielectric layer 255 described above. The top plate 260 may be of any conductive material and generally follows the same guidelines as the bottom plate 245. For one embodiment, the top plate 260 contains conductively-doped polysilicon. The top plate 260 is generally common to all cell capacitors of the memory array.

Figure 2G:
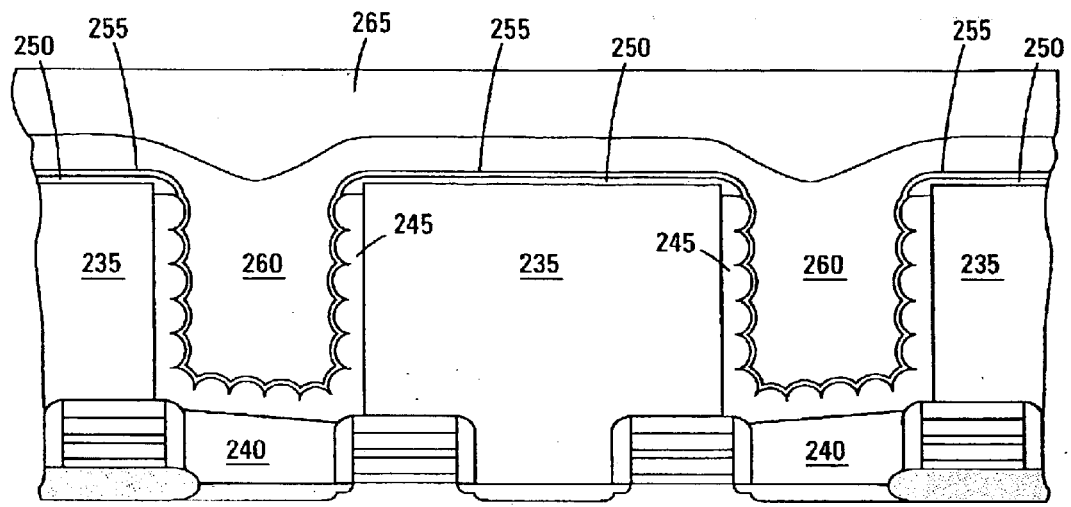
Figure 2H:
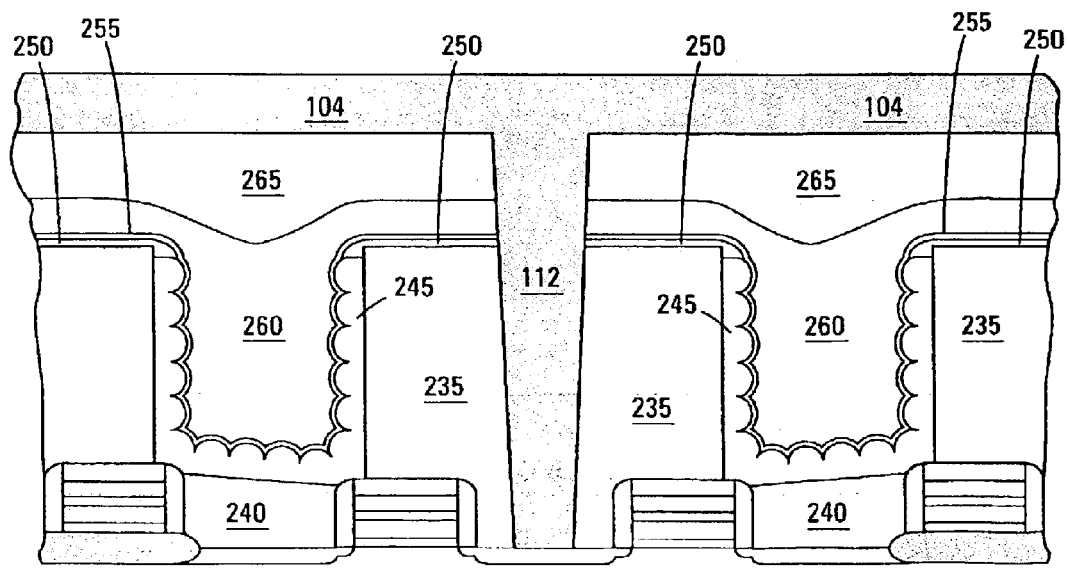

In FIG. 2G, a second insulating layer 265 is formed overlying the top plate 260. The second insulating layer 265 contains dielectric material and generally follows the same guidelines as the first insulating layer 235. In FIG. 2H, the second insulating layer 265, the top plate 260, the dielectric layer 255, the diffusion barrier layer 250 and the first insulating layer 235 are patterned to expose the second source/drain regions 229 interposed between word lines 106B. Bit line contacts 112 are then formed to provide electrical communication between the second source/drain regions 229 and a bit line 104. The bit line contacts 112 and the bit lines 104 are formed of conductive materials and may include the same types of conductive materials as found in the word lines 106. The bit lines 104 are selectively coupled to sensing devices, such as sense amplifiers, through column access circuitry for access and sensing of a target memory cell within the memory array.

Figure 2I:
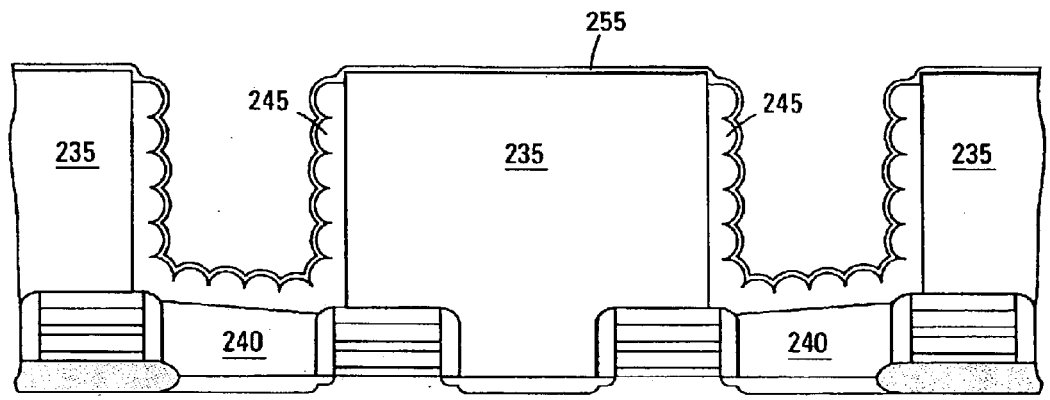
FIGS. 2I–2J are cross-sectional views of a substrate during various stages of forming a container capacitor structure in accordance with another embodiment of the invention.
Figure 2J:
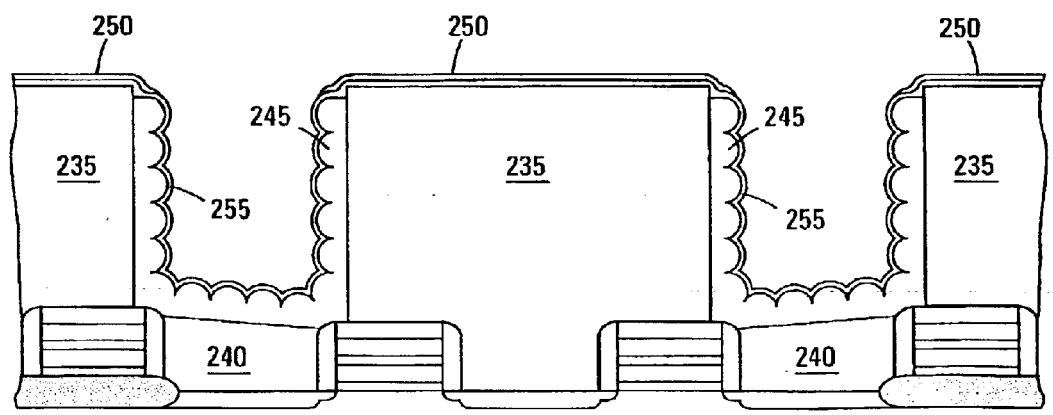

For another embodiment, the dielectric layer 255 is formed prior to the diffusion barrier layer 250. FIGS. 2I–2J are cross-sectional views taken along line A–A' of FIG. 1 during various processing stages for this alternate embodiment. Prior to the structure depicted in FIG. 2I, processing such as described with reference to FIGS. 2A–2C has been performed to create the access transistors, container holes 237, contact plugs 240 and bottom plate 245.

To ensure cleanliness of the bottom plate 245 and the surface of the first insulating layer 235, an appropriate pre-clean and/or etch process can be applied prior to formation of the dielectric layer 255 or some preceding layer. As discussed previously, such processes can be used to remove contaminants to improve adhesion and to achieve better electrical properties in the resulting structure.

In FIG. 2I, a dielectric layer 255 is formed overlying the bottom plate 245 and an upper surface of the first insulating layer 235. The dielectric layer 255 is shown to be adjoining the bottom plate 245 and the surface of the first insulating layer 235, but there is no prohibition to forming additional non-conductive layers interposed between the dielectric layer 255 and the bottom plate 245 or the first insulating layer 235. The guidelines for the selection and formation of the dielectric layer 255 are generally as presented with reference to FIG. 2E above. Note, however, that any post-formation treatment of the dielectric layer 255 should be performed after formation of the diffusion barrier layer 250.

As shown in FIG. 2J, a diffusion barrier layer 250 is formed overlying the portion of the dielectric layer 255 overlying the surface of the first insulating layer 235 and may be formed overlying a portion of the bottom plate 245. The diffusion barrier layer 250 is shown to be adjoining the dielectric layer 255, but there is no prohibition to forming additional layers interposed between the diffusion barrier layer 250 and the dielectric layer 255 described above. Such additional layers may be used to enhance adhesion or barrier properties between adjacent layers. The guidelines for the selection and formation of the diffusion barrier layer 250 are generally as presented with reference to FIG. 2D above.

The dielectric layer 255 should be substantially devoid of, or not covered by, the diffusion barrier layer 250. In this manner, the diffusion barrier layer 250 does not significantly impact the resulting capacitance of the cell capacitor. As shown in FIG. 2J, diffusion barrier layer 250 only extends over the top portions of the sidewalls of the dielectric layer 255. For one embodiment, a majority of the surface area of the dielectric layer 255 is substantially devoid of diffusion barrier layer 250. For a further embodiment, at least 95% of the surface area of the dielectric layer 255 is substantially devoid of diffusion barrier layer 250. For a still further embodiment, at least 99% of the surface area of the dielectric layer 255 is substantially devoid of diffusion barrier layer 250. For embodiments where the diffusion barrier layer 250 extends past an edge of the first insulating layer 235 to cover a top portion of the dielectric layer 255, an additional advantage is observed in that leakage current at the corner of the resulting cell capacitor is reduced.

The diffusion barrier layer 250 is preferably formed by a method that will produce a layer of material on that portion of the dielectric layer 255 overlying the surface of the first insulating layer 235 in preference to the sidewalls of the dielectric layer 255 in the container holes 237. Such processing is described with reference to FIG. 2D. Subsequent processing to complete the container capacitor structure is described with reference to FIGS. 2F–2H.

The figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

While the foregoing embodiments of capacitor structures may be used in a variety of integrated circuit devices, they are particularly suited for use as storage capacitors of memory cells found in dynamic memory devices.

Figure 3:
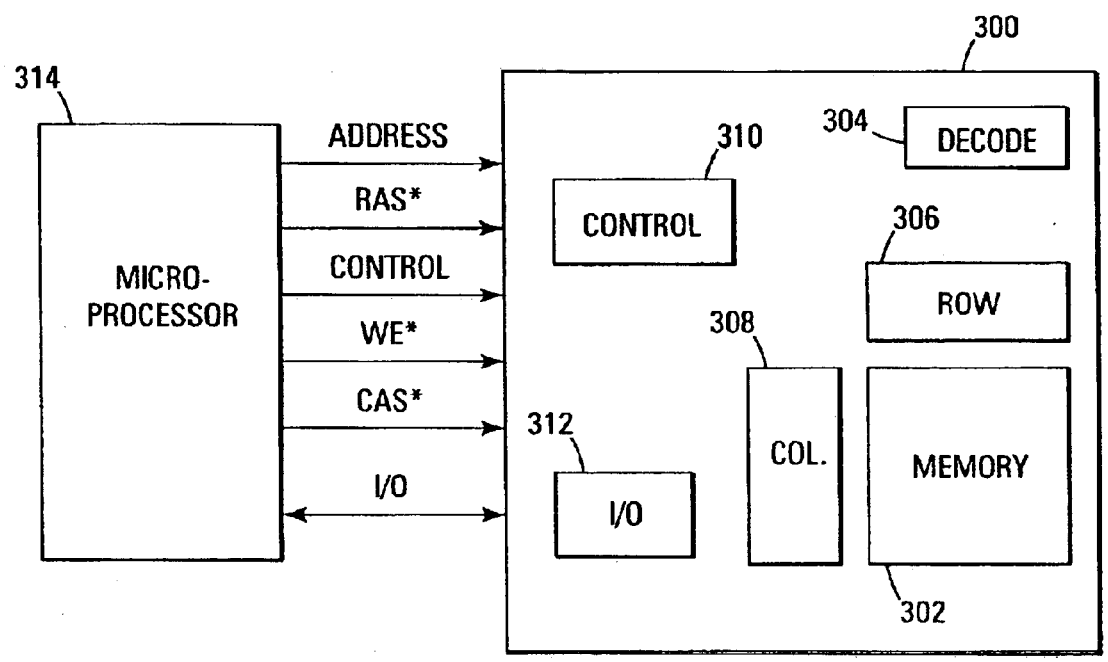
FIG. 3 is a simplified block diagram of an integrated circuit memory device in accordance with an embodiment of the invention.

FIG. 3 is a simplified block diagram of an integrated circuit memory device in accordance with an embodiment of the invention. The memory device 300 includes an array of memory cells 302, an address decoder 304, row access circuitry 306, column access circuitry 308, control circuitry 310, and Input/Output (I/O) circuitry 312. The memory device 300 can be coupled to an external microprocessor 314, or memory controller for memory accessing. The memory device 300 receives control signals from the processor 314, such as WE*, RAS* and CAS* signals. The memory cells are used to store data that are accessed via I/O lines. The memory cells are accessed in response to the control signals and the address signals. It will be appreciated by those skilled in the art that additional circuitry and control signals can be provided, and that the memory device of FIG. 3 has been simplified to help focus on the invention. At least one of the memory cells of the array of memory cells 302 has a container capacitor of the invention.

It will be understood that the above description of a DRAM (Dynamic Random Access Memory) is intended to provide a general understanding of the memory and is not a complete description of all the elements and features of a DRAM. Further, the invention is equally applicable to a variety of sizes and types of memory circuits and is not intended to be limited to the DRAM described above.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

CONCLUSION

Semiconductor container capacitor structures having a diffusion barrier layer to reduce damage of the bottom cell plate and any underlying transistor from species diffused through the surrounding insulating material have been described. The diffusion barrier layer can protect the bottom cell plate, any underlying access transistor and even the surface of the surrounding insulating layer during processing including pre-treatment, formation and post-treatment of the capacitor dielectric layer. The diffusion barrier layer inhibits or impedes diffusion of species that may cause damage to the bottom plate or an underlying transistor, such as oxygen-containing species, hydrogen-containing species and/or other undesirable species. The diffusion barrier layer is formed separate from the capacitor dielectric layer. This facilitates thinning of the dielectric layer as the dielectric layer need not provide such diffusion protection. Thinning of the dielectric layer in turn facilitates higher capacitance values for a given capacitor surface area.

While the invention has been described and illustrated with respect to forming container capacitors for a memory cell, it should be apparent that the same processing techniques can be used to form container capacitors for other applications and integrated circuit devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other materials, shapes, deposition processes and removal processes may be utilized with the invention. Accordingly, this application is intended to cover any adaptations or variations of the invention. It is manifestly intended that this invention be limited only by the following claims and equivalents thereof.

What is claimed is:

1. A semiconductor container capacitor structure, comprising:
   a bottom plate overlying sidewalls and a closed bottom of a container hole, wherein the sidewalls of the container hole are defined by a surrounding insulating layer;
   a top plate;
   a dielectric layer overlying at least a portion of a surface of the insulating layer and
   interposed between the bottom plate and the top plate; and
   a diffusion barrier layer overlying at least the portion of the surface of the insulating layer and interposed between the dielectric layer and the top plate;
   wherein a majority of a surface area of the bottom plate is not covered by the diffusion barrier layer; and
   wherein the diffusion barrier layer is overlying and adjoining the dielectric layer.

2. A semiconductor container capacitor structure, comprising:
   a bottom plate overlying sidewalls and a closed bottom of a container hole, wherein the sidewalls of the container hole are defined by a surrounding insulating layer;
   a dielectric layer overlying the bottom plate and at least a portion of a surface of the insulating layer adjacent the container hole;
   a diffusion barrier layer overlying at least the portion of the dielectric layer overlying the portion of the surface of the insulating layer; and
   a top plate overlying the dielectric layer.

3. The semiconductor container capacitor structure of claim 2, wherein the bottom plate comprises a conductive material selected from the group consisting of conductively-doped polysilicon, conductively-doped hemispherical-grain polysilicon, metals, metal nitrides, metal alloys and conductive metal oxides.

4. The semiconductor container capacitor structure of claim 2, wherein the bottom plate comprises a plurality of conductive layers.

5. The semiconductor container capacitor structure of claim 2, wherein the bottom plate is overlying and adjoining the sidewalls and the closed bottom of the container hole.

6. The semiconductor container capacitor structure of claim 2, wherein the top plate comprises a conductive material selected from the group consisting of conductively-doped polysilicon, conductively-doped hemispherical-grain polysilicon, metals, metal nitrides, metal alloys and conductive metal oxides.

7. The semiconductor container capacitor structure of claim 2, wherein the top plate is overlying and adjoining a portion of the dielectric layer and overlying and adjoining the diffusion barrier layer.

8. The semiconductor container capacitor structure of claim 2, wherein the diffusion barrier layer comprises a dielectric material having a diffusion rate for oxygen-containing species that is lower than a diffusion rate for the oxygen-containing species through the insulating layer.

9. The semiconductor container capacitor structure of claim 2, wherein the diffusion barrier layer comprises a dielectric material having a diffusion rate for hydrogen that is lower than a diffusion rate for hydrogen through the insulating layer.

10. The semiconductor container capacitor structure of claim 2, wherein the diffusion barrier layer comprises a dielectric material having a diffusion rate for oxygen-containing containing species that is lower than a diffusion rate for the oxygen-containing species through a silicon oxide material selected from the group consisting of undoped silicon dioxide and doped silicon dioxide.

11. The semiconductor container capacitor structure of claim 2, wherein the diffusion barrier layer comprises a dielectric material having a diffusion rate for oxygen-containing species that is lower than a diffusion rate for the oxygen-containing species through borophosphosilicate glass.

12. The semiconductor container capacitor structure of claim 2, wherein the diffusion barrier layer comprises a silicon-based dielectric material.

13. The semiconductor container capacitor structure of claim 12, wherein the silicon-based dielectric material is selected from the group consisting of silicon nitride and silicon oxynitride.

14. The semiconductor container capacitor structure of claim 2, wherein the diffusion barrier layer is overlying and adjoining the portion of the dielectric layer overlying the surface of the insulating layer.

15. The semiconductor container capacitor structure of claim 14, wherein a remaining portion of the dielectric layer not adjoining the diffusion barrier layer includes a majority of a surface area of the dielectric layer.

16. The semiconductor container capacitor structure of claim 2, wherein the dielectric layer comprises a dielectric material selected from the group consisting of silicon nitride, silicon oxynitride and dielectric metal oxides.

17. The semiconductor container capacitor structure of claim 2, wherein the dielectric layer is overlying and adjoining the bottom plate and the portion of the surface of the insulating layer.

18. The semiconductor container capacitor structure of claim 2, wherein the insulating layer comprises a dielectric material selected from the group consisting of silicon oxides, silicon nitrides and silicon oxynitrides.

19. The semiconductor container capacitor structure of claim 18, wherein the insulating layer comprises a doped silicon oxide dielectric material.

20. The semiconductor container capacitor structure of claim 2, wherein the insulating layer comprises borophosphosilicate glass.

21. A semiconductor container capacitor structure, comprising:
   a bottom plate overlying sidewalls and a closed bottom of a container hole, wherein the sidewalls of the container hole are defined by a surrounding insulating layer;
   a dielectric layer overlying and adjoining the bottom plate and at least a portion of a surface of the insulating layer adjacent the container hole;
   a diffusion barrier layer overlying and adjoining at least the portion of the dielectric layer overlying the surface of the insulating layer; and
   a top plate overlying the dielectric layer.

22. The semiconductor container capacitor structure of claim 21, wherein the diffusion barrier layer comprises a dielectric material having a diffusion rate for at least one species selected from the group consisting of an oxygen-containing species, a hydrogen-containing species, a fluorine-containing species and a chlorine-containing species that is lower than a diffusion rate for the at least one species through the insulating layer.

23. The semiconductor container capacitor structure of claim 21, wherein the diffusion barrier layer contains a silicon-based material.

24. The semiconductor container capacitor structure of claim 23, wherein the silicon-based material is selected from the group consisting of silicon nitride and silicon oxynitride.

25. The semiconductor container capacitor structure of claim 21, wherein a majority of a surface area of the dielectric layer is not covered by the diffusion barrier layer.

26. A semiconductor container capacitor structure, comprising:
- a container hole having sidewalls, an open top and a closed bottom, wherein the sidewalls of the container hole are defined by a surrounding insulating layer and wherein the open top of the container hole is defined by an upper surface of the insulating layer;
- a first conductive layer overlying the sidewalls and closed bottom of the container hole;
- a dielectric layer overlying the first conductive layer and the upper surface of the insulating layer;
- a diffusion barrier layer overlying a first portion of the dielectric layer overlying the upper surface of the insulating layer; and
- a second conductive layer overlying the diffusion barrier layer and a remaining portion of the dielectric layer;
- wherein a majority of a surface area of the dielectric layer is substantially devoid of the diffusion barrier layer.

27. A semiconductor container capacitor structure, comprising:
- a layer of conductively-doped hemispherical-grain polysilicon in a container hole, wherein the container hole has sidewalls, an open top and a closed bottom, and wherein the sidewalls of the container hole are defined by a surrounding insulating layer and the open top of the container hole is defined by an upper surface of the insulating layer;
- a first layer of silicon nitride on the upper surface of the insulating layer and the layer of conductively-doped hemispherical-grain polysilicon;
- a second layer of silicon nitride on a first portion of the first layer of silicon nitride overlying the upper surface of the insulating layer; and
- a layer of conductively-doped polysilicon on the second layer of silicon nitride and a remaining portion of the first layer of silicon nitride.

28. The semiconductor container capacitor structure of claim 27, wherein the first layer of silicon nitride is formed using a first deposition technique and the second layer of silicon nitride is formed using a second deposition technique different from the first deposition technique.

29. The semiconductor container capacitor structure of claim 28, wherein the second deposition technique is performed under operating conditions to preferentially deposit silicon nitride on the first portion of the first layer of silicon nitride.

30. A semiconductor container capacitor structure, comprising:
- a layer of conductively-doped hemispherical-grain polysilicon in a container hole, wherein the container hole has sidewalls, an open top and a closed bottom, and wherein the sidewalls of the container hole are defined by a surrounding insulating layer and the open top of the container hole is defined by an upper surface of the insulating layer;
- a first layer of silicon nitride on the upper surface of the insulating layer and the layer of conductively-doped hemispherical-grain polysilicon;
- a second layer of silicon nitride on a first portion of the first layer of silicon nitride overlying the upper surface of the insulating layer; and
- a layer of conductively-doped polysilicon on the second layer of silicon nitride and a remaining portion of the first layer of silicon nitride,
- wherein the first layer of silicon nitride is formed using a first deposition technique and the second layer of silicon nitride is formed using a second deposition technique different from the first deposition technique,
- wherein the second deposition technique is performed under operating conditions to preferentially deposit silicon nitride on the first portion of the first layer of silicon nitride; and
- wherein the second deposition technique is performed under operating conditions to preferentially deposit silicon nitride on the first portion of the first layer of silicon nitride and to leave a majority of a surface area of the first layer of silicon nitride substantially devoid of the second layer of silicon nitride.

* * * * *